(12) United States Patent
Tokunaga et al.

(10) Patent No.: US 6,712,111 B2
(45) Date of Patent: Mar. 30, 2004

(54) BONDING METHOD AND APPARATUS

(75) Inventors: Tetsuya Tokunaga, Kadoma (JP);
Takahiro Yonezawa, Neyagawa (JP);
Hiroyuki Kiyomura, Takatsuki (JP);
Tatsuo Sasaoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 10/094,773

(22) Filed: Mar. 11, 2002

(65) Prior Publication Data
US 2002/0125303 A1 Sep. 12, 2002

(30) Foreign Application Priority Data
Mar. 9, 2001 (JP) ........................................ 2001-065978

(51) Int. Cl.[7] .................. B23B 31/00; H01L 21/306; H01L 21/44; H01L 21/78
(52) U.S. Cl. .................. 156/510; 156/345.14; 438/118; 438/464; 228/179.1; 228/180.22
(58) Field of Search ........................ 228/180.22, 252, 228/4.1, 173.6, 179.1; 156/345.14, 249, 510; 438/15, 118, 113, 460, 464

(56) References Cited

U.S. PATENT DOCUMENTS

| | | | |
|---|---|---|---|
| 4,522,679 A | * | 6/1985 | Funakoshi et al. ........... 156/510 |
| 5,332,406 A | * | 7/1994 | Takeuchi et al. .............. 225/25 |
| 5,654,204 A | * | 8/1997 | Anderson .................... 438/15 |
| 6,245,646 B1 | * | 6/2001 | Roberts ....................... 438/464 |
| 6,383,844 B2 | * | 5/2002 | Mimata et al. ............. 438/118 |
| 6,396,290 B1 | * | 5/2002 | Kimura et al. .............. 324/755 |
| 2001/0004002 A1 | * | 6/2001 | Arai et al. ................... 156/249 |
| 2002/0072202 A1 | * | 6/2002 | Odashima et al. .......... 438/460 |

FOREIGN PATENT DOCUMENTS

JP 2000-277545 A * 10/2000

* cited by examiner

Primary Examiner—L. Edmondson
(74) Attorney, Agent, or Firm—Jordan and Hamburg LLP

(57) ABSTRACT

A carrier tool having a protective ring with a sheet extended over an underside of the ring is used, a semiconductor wafer is made to adhere to the sheet, the semiconductor wafer, being surrounded by the protective ring, is carried from a container device to a bonding stage. Bonding is performed on the bonding stage, and the wafer is carried out to another container device, consequently damage of the wafer is avoided.

20 Claims, 10 Drawing Sheets

BONDING METHOD AND APPARATUS

The present disclosure relates to subject matter contained in priority Japanese Patent Application No. 2001-65978, filed on Mar. 9, 2001, the contents of which is herein expressly incorporated by reference in its entirety.

BACKGROUND OF THE INVENTION

1. Field of the Invention

The present invention relates to a bonding method and apparatus for performing a bump bonding and a wire bonding.

2. Description of Related Art

A flip chip technique and a wire bonding technique are known as techniques for mounting semiconductor electronic components such as a bare chip type of semiconductor integrated circuit chips (IC chips) on a circuit assembly having substrates, parts and others.

Recently, IC chips have been progressively smaller and thinner with miniaturization of portable electronic devices. Apparatus for performing bump bonding to respective electrode pads on semiconductor wafers before dicing, have been provided.

As shown in FIG. 15, a bonding stage 110 of a conventional bump bonding apparatus positions a semiconductor wafer 201 and adherently holds the wafer through a plurality of suction holes 111, and heats the wafer having a circuit formed thereon to a temperature required for forming bumps on electrodes on the circuit using a heater 30.

A bonding head 120, which forms bumps on the electrodes on the semiconductor wafer 201, has a wire supply 121 for supplying gold wire 31 as a material for the bump, a ball press tool 122 for melting the gold wire 31 to be formed a molten ball and pressing the ball to the electrodes, and a ultrasonic wave generator (not shown) for providing ultrasonic wave effect on the bumps during the press. The bonding head 120 is positioned on an X-Y table 160 having a ball screw and movable along X and Y directions perpendicular to each other in a plane, and the table 160 drives to move the bonding head 120 so that the head forms bumps on predetermined electrodes on the semiconductor wafer 201.

In the above conventional bump bonding apparatus, however, following problems exist when a thin semiconductor wafer of which thickness is about 0.2 mm and lower is used.

First, when the semiconductor wafer is pinched by a transfer device of the bump bonding apparatus, crack or chipping tends to occur in the wafer due to mechanical stress.

Further, when the semiconductor wafer is adherently held through the suction holes 111 on the bonding stage 110, an area 200a in the wafer 201 located above the hole 111 (see FIG. 16) indents into depth of the hole 111, and circuits in the wafer may break or the entire area 200a may be damaged. In addition, in the area 200a, since the area 200a is suspended in air, the ultrasonic wave, used for bumping or wire bonding, is transmitted worse and bumps may be non-deposited, or crack and breach may occur in the wafer 201 when the ball press tool of the bonding head 120 presses the wafer 201 during the bonding.

In case of a thin wafer having a circuit-forming side covered by a protective polyimide film, the wafer often warps up toward the circuit-forming side in such a configuration that its border displaces upwardly about center of the wafer. Such a semiconductor wafer is hard-to be adhered to the upper face of the bonding stage 110 through the suction holes 111, and vicinity of the border frequently remains displaced. When the bumping is performed to the semiconductor wafer on the bonding stage 110 in this condition, if the bonding is required a load not more than a downward load for correcting the displacement near the border, in most cases the ultrasonic wave is applied to the molten ball in a condition that the border of the wafer is left floating in air, so the ultrasonic wave cannot be transmitted sufficiently to the molten ball, and thus the bumps may probably be non-deposited.

SUMMARY OF THE INVENTION

In light of the foregoing prior art problems, the present invention is directed to solve the above problems regarding the carrying of the semiconductor wafer and the hold of the wafer during the bonding. That is, an object of the invention is to provide a bonding method and apparatus where damage such as a crack, chipping, and break of the circuit do not occur in the wafer during the carrying, in addition the damage of the wafer and the break of the circuit during the suction and hold of the wafer, and the break of the wafer and the rising of the border of the wafer during the bumping are avoided.

To achieve the above objects, according to the invention, a carrier tool having a protective ring with a sheet extended over its underside is used, a semiconductor wafer is made to adhere to the sheet of the carrier tool, the wafer, being surrounded by the protective ring, is carried from a container device into a bonding stage, bonding is performed on the bonding stage, and the wafer is carried out of the bonding stage into another container device.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Embodiments of the present invention will be described with reference to the drawings.

In this embodiment, a bump bonding apparatus designed for wafers is described. The invention is not limited to the bump bonding apparatus and applicable for the wire bonding apparatus.

Figure 11:
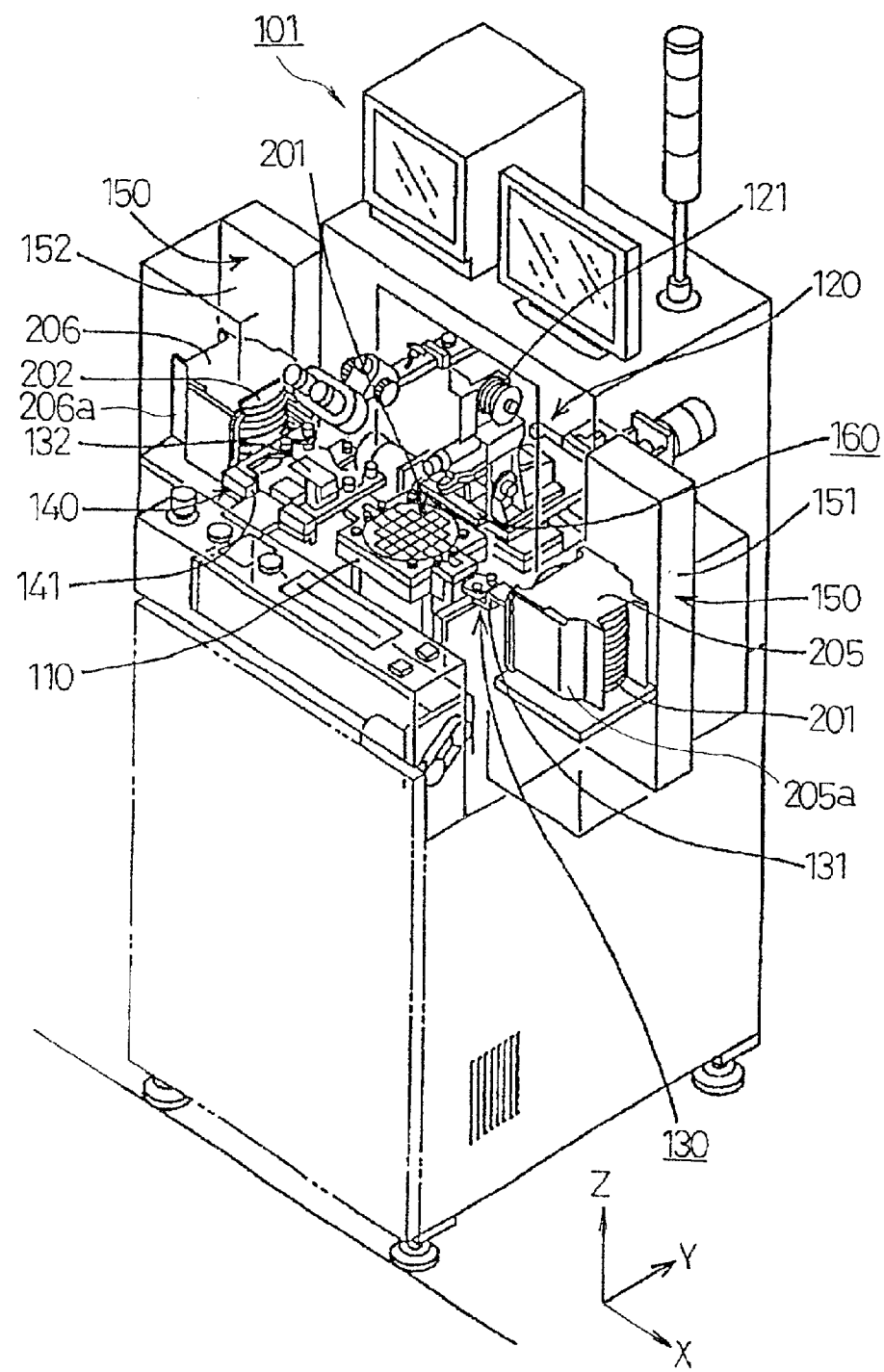
FIG. 11 is a perspective view showing a bump bonding apparatus.

FIG. 11 is a perspective view showing a bump bonding apparatus 101. The bonding apparatus 101 includes a bonding stage 110, a bonding head 120, a carrier device 130, a transfer device 140, and a container device 150. Hereinafter, each of the components will be described.

The container device 150 includes a carry-in side container device 205 and a carry-out side container device 206. The container device 205 has a first container 205a for containing the semiconductor wafer 201 before bumping and a first elevator 151 for shifting the container vertically, and the container device 206 has a second container 206a for containing the wafer 201 after bumping and a second elevator 152 for shifting the container vertically. The semiconductor wafer 201 contained in the first or the second container 205a or 206a is supported by a collar formed in the container 205a or 206a, respectively.

Figure 12:
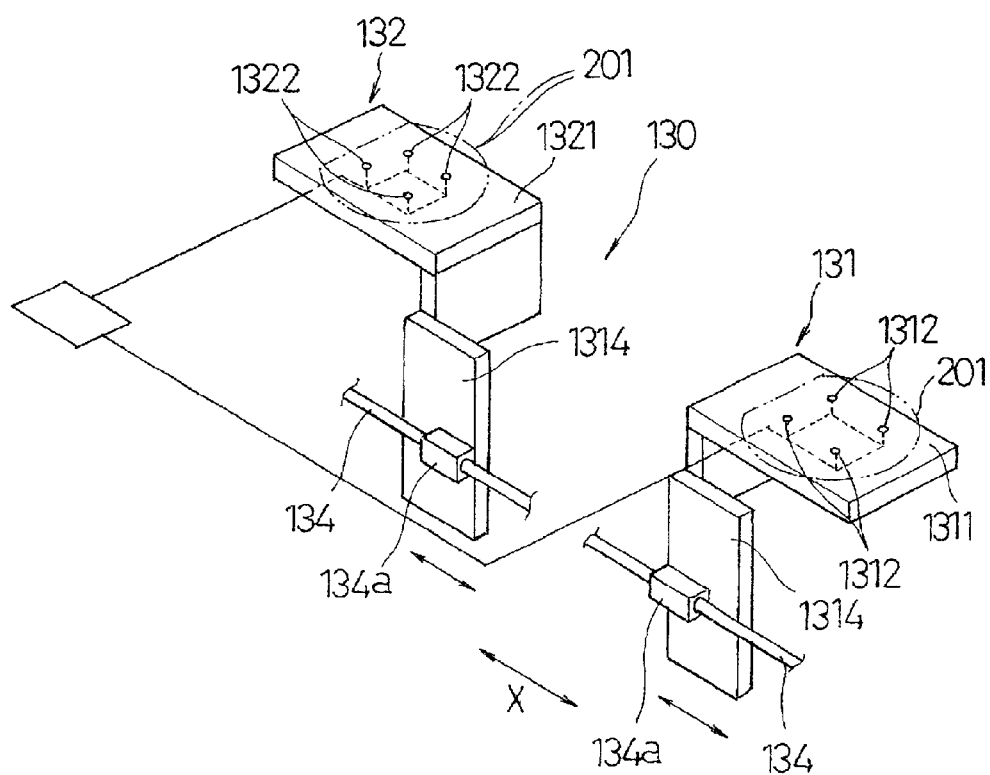
FIG. 12 is a perspective view showing a carrier device provided in the bump bonding apparatus.

The carrier device 130 includes a carry-in device 131 and a carry-out device 132. The carry-in device 131 removes the semiconductor wafer 201 from the carry-in side container device 205, and the carry-out device 132 transfers the semiconductor wafer 201 to the carry-out side container device 206. The bonding stage 110 is located between the carry-in device 131 and the carry-out device 132 as shown in FIG. 11. The carry-in device 131 moves between the first container 205a and the bonding stage 110, and the carry-out device 132 moves between the bonding stage 110 and the second container 206a. As shown in FIG. 12, the carry-in device 131 and the carry-out device 132 are provided in line along the X direction shown in the figure, and shifted along the X direction independently by an air cylinder 134.

The carry-in device 131 has a carry-in stage 1311 attached to a support member 1314 as shown in FIG. 12, and the semiconductor wafer 201 before bumping is positioned on the stage 1311. A plurality of suction holes 1312 for adherently holding the semiconductor wafer 201 are provided on an upper face of the carry-in stage 1311. In operation of such configured carry-in device 131, first the carry-in stage 1311 is shifted by a movable portion 134a of the air cylinder to a position corresponding to a position for removing the semiconductor wafer 201 within the first container 205a, next the first elevator 151 vertically moves in order to position the semiconductor wafer 201 within the first container 205a on the carry-in stage 1311. The semiconductor wafer 201 positioned on the carry-in stage 1311 is adherently held through the suction holes 1312. Then, the semiconductor wafer 201 on the carry-in stage 1311 is pinched by the transfer device 140 shown in FIG. 11 and transferred to the bonding stage 110.

The carry-out device 132 has a carry-out stage 1321 on which the semiconductor wafer 201 after bumping is positioned, the stage 1321 being attached to the support member 1314 as shown in FIG. 12. A plurality of suction holes 1322 for adherently holding the semiconductor wafer 201 are provided on an upper face of the carry-out stage 1321. In operation of such configured carry-out device 132, the semiconductor wafer 201 on the bonding stage 110 is transferred to the carry-out stage 1321 by the transfer device 140, then the carry-out stage 1321 is shifted by the movable portion 134a of the air cylinder to a position corresponding to a position for containing the wafer into the second container 206a, and then the second elevator 152 vertically moves in order to contain the semiconductor wafer 201 positioned on the carry-out stage 1321 in the second container 206a.

Figure 13:
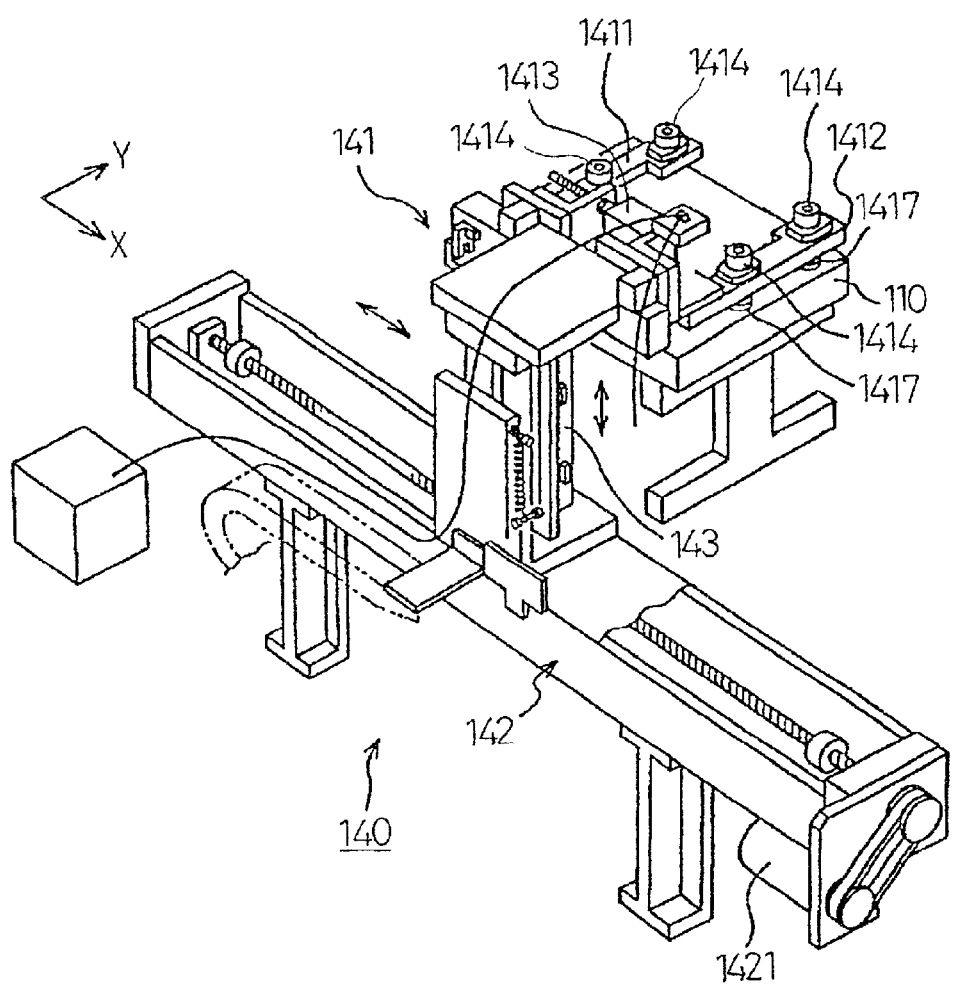
FIG. 13 is a perspective view showing a transfer device provided in the bump bonding apparatus.

The transfer device 140 transfers the semiconductor wafer 201 before bumping from the carry-in device 131 to the bonding stage 110, and transfers the wafer 201 after bumping from the bonding stage 110 to the carry-out device 132. As shown in FIG. 13, the device 140 has a single holder 141 for holding the semiconductor wafer 201, a driver 142, driven by a motor 1421 having a ball screw mechanism, for shifting the holder 141 along the X direction, and a mover 143 for moving the holder 141 up and down along thickness of the held semiconductor wafer 201. The holder 141 transfers the semiconductor wafer 201 among the bonding stage 110, the carry-in device 131, and the carry-out device 132.

Figure 14:
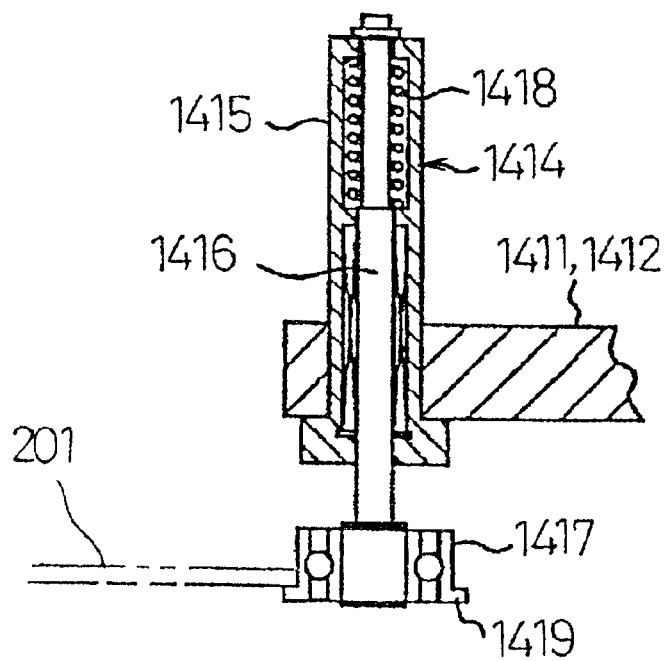
FIG. 14 is a detailed view of a clamp mechanism.
Figure 15:
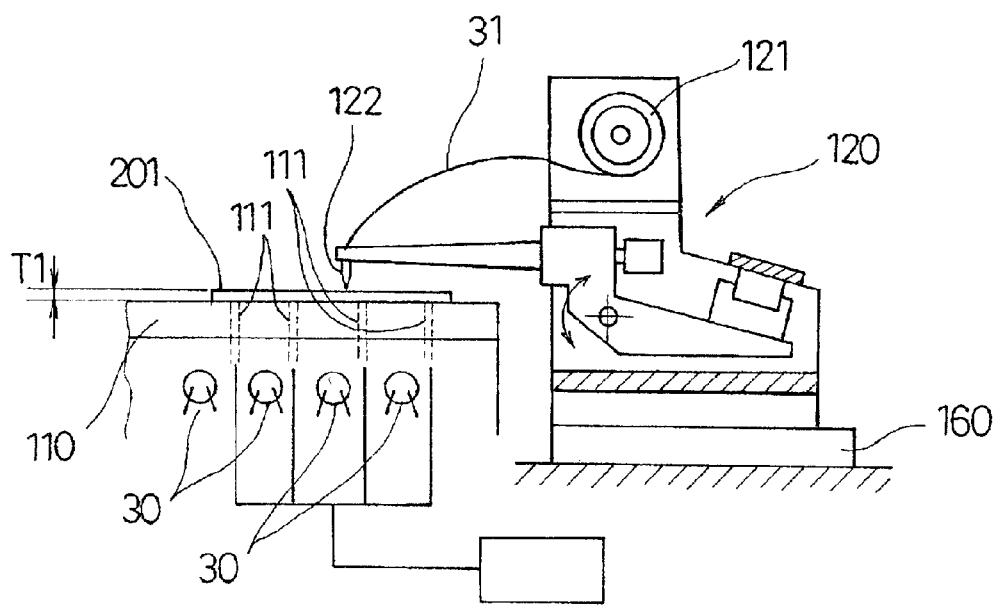
FIG. 15 is a side view showing a bonding head and a bonding stage in a conventional bump bonding apparatus.
Figure 16:
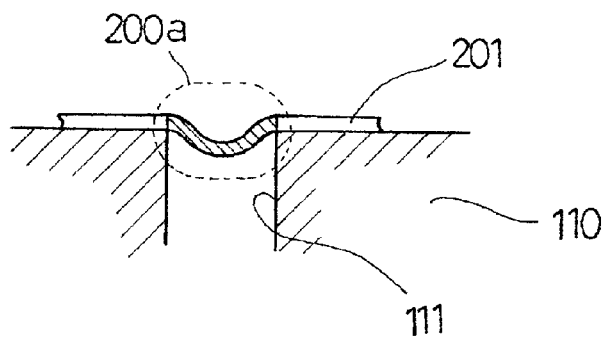
FIG. 16 is a partial enlarged view of FIG. 15.

The holder 141 has clamp members 1411 and 1412 for pinching the semiconductor wafer 201 and a drive mechanism 1413 for bringing near or separating the clamp members along the shown X direction. In the clamp members 1411 and 1412, two sets of clamps 1414 are respectively provided so as to face each other. As shown in FIG. 14, the clamp 1414 has a housing 1415 through the clamp members 1411 and 1412 along their thickness, a pin 1416 slidable along its axis in the housing 1415, a clamp roller 1417 having a collar 1419 for preventing fall of the wafer, the roller being attached to the bottom edge of the pin 1416 pivotably about the axis of the pin, and a spring 1418 for energizing the pin 1416 downwardly. Such clamps 1414 are located at four places around the semiconductor wafer 201 pinched by the clamp member 1411, and hold the wafer 201 with the clamp rollers 1417 at the places.

First, in the carry-in device 131, the first elevator 151 operates to locate the semiconductor wafer 201 before bumping at a height where the wafer can be removed from the first container 205a by the carry-in stage 1311, and moves the first container 205a vertically. Next, the stage 1311 is shifted so as to be inserted into the container 205a, the container 205a is shifted down by the elevator 151 to an extent that the contained semiconductor wafer 201 rises from the collar in the container 205a, the wafer 201 is adherently held through the suction holes 1312 on the upper face of the stage 1311, and the semiconductor wafer 201 is removed.

Next, the removed semiconductor wafer 201 is transferred onto the bonding stage 110 by the transfer device 140. Then, bumps are formed on the semiconductor wafer 201 by the bonding head 120 that keeps being shifted by the X-Y table 160.

After the bumps are formed on all of the required places, the semiconductor wafer 201 is transferred from the bonding stage 110 to the carry-out stage 1321 of the carry-out device 132, and adherently held through the suction holes 1322 on the upper face of the carry-out stage 1321.

Next, the second elevator 152 operates to locate the semiconductor wafer 201 positioned on the carry-out stage 1321 at a height where the wafer can be contained in the second container 206a. Next, the carry-out stage 1321 moves to be inserted into the second container 206a, and the wafer 201 is released from the holding condition through the suction holes 1322, then the second elevator 152 is moved up to contain the wafer 201 in the container 206a.

Figure 2:
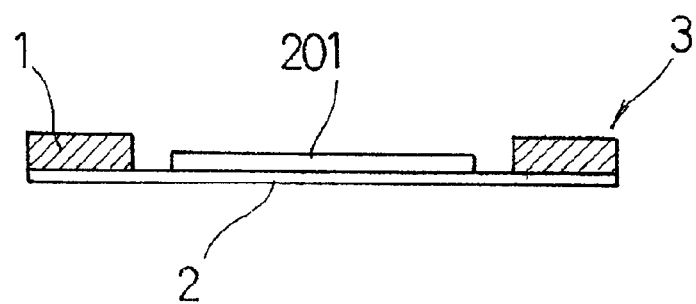
FIG. 2 is a cross-sectional view showing a carrier tool holding the semiconductor wafer according to the embodiment.
Figure 3:
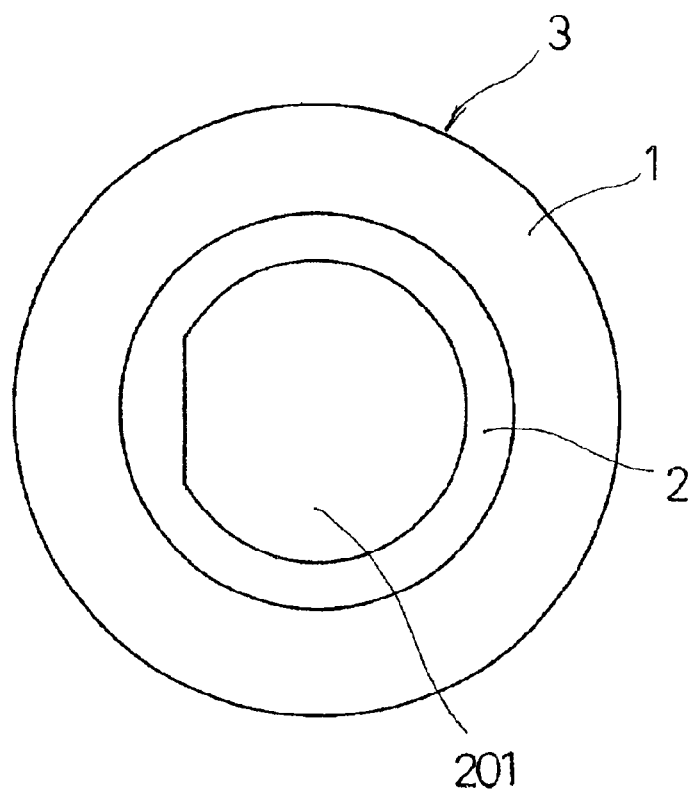
FIG. 3 is a plan view of the carrier tool holding the wafer.

In this embodiment, as shown in FIG. 2 and FIG. 3, a carrier tool 3 having a protective ring 1 with a sheet 2 for mounting a wafer, the sheet being extended over the underside of the protective ring 1, is used. The semiconductor wafer 201 is made to adhere to the sheet 2, and the wafer 201 is carried with the ring 1 surrounding the wafer 201. Then the bonding is carried out.

The protective ring 1 is of metal or others and made annular. The sheet 2 is of a heat resistant resin sheet having a sufficient heat resistance, because the semiconductor wafer 201 before bumping is heated to a desired temperature for bonding on the bonding stage. In addition, the sheet 2 is made to adhere and is held to the underside of the protective ring 1, and is extended over the ring 1 so as to cover the entire underside of the ring 1. Further, the upper face of the sheet 2 is adhesive so that the wafer 201 is adherently mounted. When the carrier tool 3 holding the semiconductor wafer 201 before bonding is transferred from the first container 205a of the carry-in side container device 205 to the bonding stage 110, first the carrier tool 3 holding the wafer 201 is removed from the first container 205a in condition that the protective ring 1 is adherently held on the carry-in stage 1311, then the carrier tool 3 is transferred onto the bonding stage 110 by the transfer device 140 which keeps pinching circumference of the ring 1.

The semiconductor wafer 201 is adherently held on the bonding stage 110 via the sheet 2 by a suction device provided in the bonding stage 110 during the bonding.

Further, when the carrier tool 3 holding the semiconductor wafer 201 after bonding is transferred from the bonding stage 110 to the second container 206a of the carry-out side container device 206, first the carrier tool 3 is transferred from the bonding stage 110 onto the carry-out stage 1312 of the carry-out device 132 by the transfer device 140 which keeps pinching the circumference of the protective ring 1, then the carrier tool 3 is contained in the second container 206a of the carry-out side container device 206 in condition that the protective ring 1 is adherently held on the carry-out stage 1312.

In the carry-in stage 1311 and the carry-out stage 1312, a plurality of suction holes (not shown) for adherently holding the carrier tool 3 are formed along the circumference of the protective ring 1. In this configuration, the semiconductor wafer 201 is carried in and out without acting suction force directly on the wafer.

Figure 1:
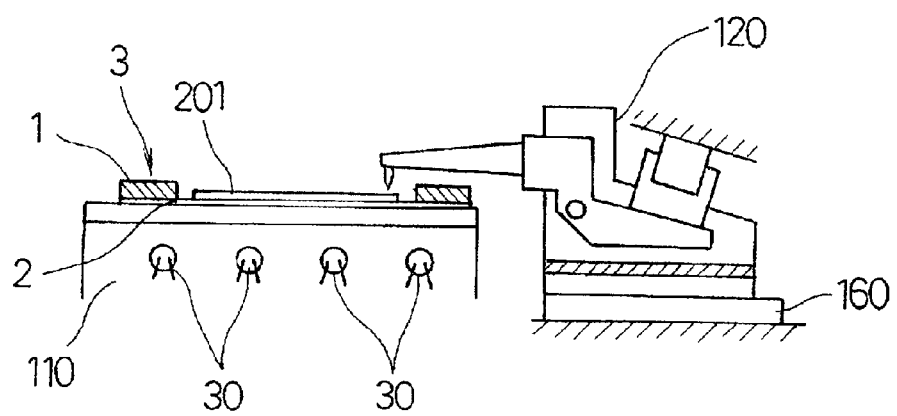
FIG. 1 is a side view showing a wafer held on a bonding stage in a bump bonding apparatus according to an embodiment of the present invention.
Figure 4:
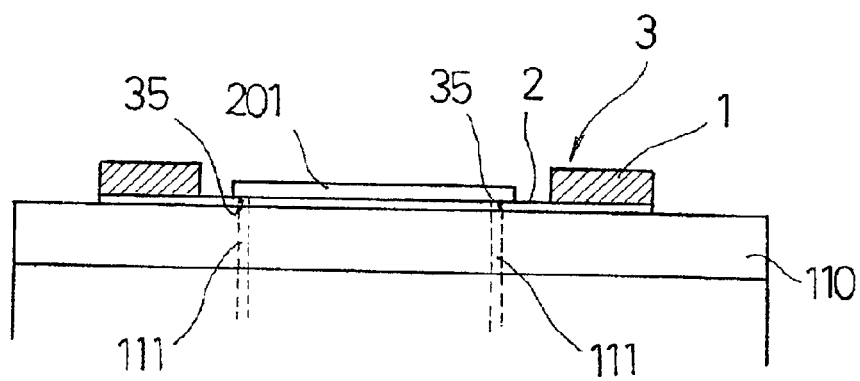
FIG. 4 is a cross-sectional view showing the wafer held on the bonding stage according to the embodiment.
Figure 5:
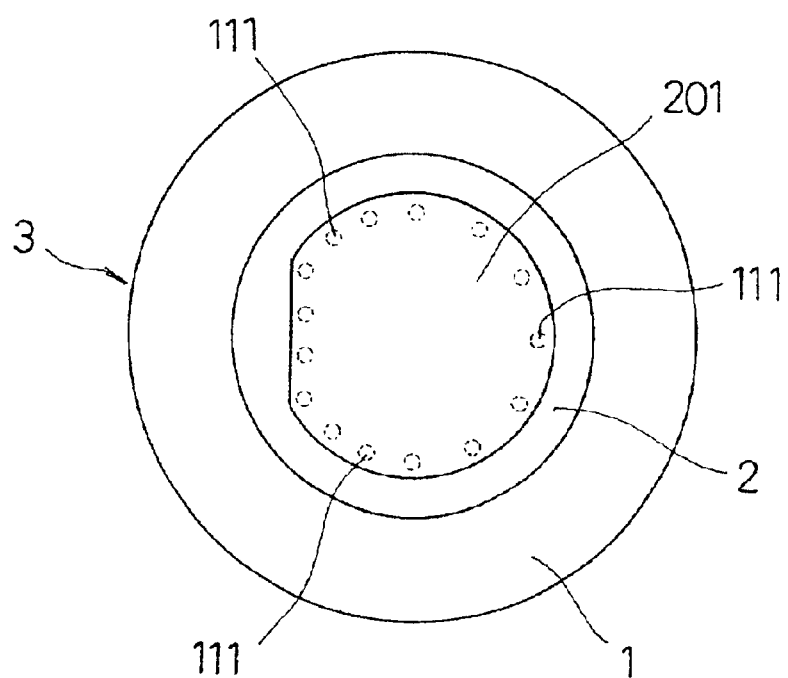
FIG. 5 is a plan view of the wafer held on the bonding stage.

Next, a specific configuration for making the carrier tool 3 holding the semiconductor wafer 201 adhere to the bonding stage 110 will be described with reference to FIG. 1, FIG. 4, and FIG. 5.

In the bonding stage 110, a plurality of suction holes 111 are formed along a line where the border of the semiconductor wafer 201 is located when the carrier tool 3 is positioned, and slightly nearer to center from the line. The semiconductor wafer 201 is held by pulling the wafer by means of a suction force applied through the holes 111 via the sheet 2. The heat resistant sheet 2 may have a plurality of through-holes 35 at the same positions as those of the suction holes 111. In this configuration, the semiconductor wafer 201 is held more securely because the suction force is directly applied to it.

As described above, if the bonding stage 110 has the plurality of suction holes 111 located near a position corresponding to the border of the semiconductor wafer 201, and the wafer 201 is made to adhere and is held to the bonding stage 110 via the sheet 2 through the suction holes 111, an advantage is provided, that is, the wafer is adherently held only in the border of the wafer where circuit-patterning defects are frequently occurred and thus products of the semiconductor are hardly obtained. Alternatively, a suction hole with an annular groove can be provided on the bonding stage 110 near the border of the semiconductor wafer 201.

Figure 6:
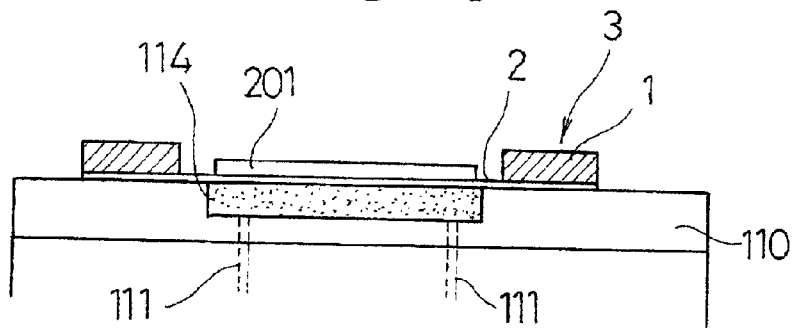
FIG. 6 is a cross-sectional view showing a wafer held on a bonding stage according to another embodiment of the invention.

As another holding method of the carrier tool 3, as shown in FIG. 6, a porous plate 114 is provided in the entire area where the wafer is positioned on the bonding stage 110, and the suction holes 111 are connected to the plate 114. A pressure reducing device (not shown) connected to the holes 111 depressurizes inside of the plate 114, whereby the semiconductor wafer 201 is adherently held via the sheet 2. The porous plate 114 may be arranged only in the vicinity of the border of the wafer in the area in which the wafer is positioned. In addition, one or more through-holes may be formed in the sheet 2. Although a diameter of the suction hole is 0.2 mm at minimum in the conventional bonding stage due to limitation of machining, if the porous plate is used, the hole can be formed as small as about 0.05 mm in diameter. Thus, any concave deformation due to the suction force is avoided, and the wafer is held without the damage of the wafer and the break of the circuit in all regions of the wafer including the vicinity of the border. Preferably, the porous plate is made of ceramics.

Figure 7:
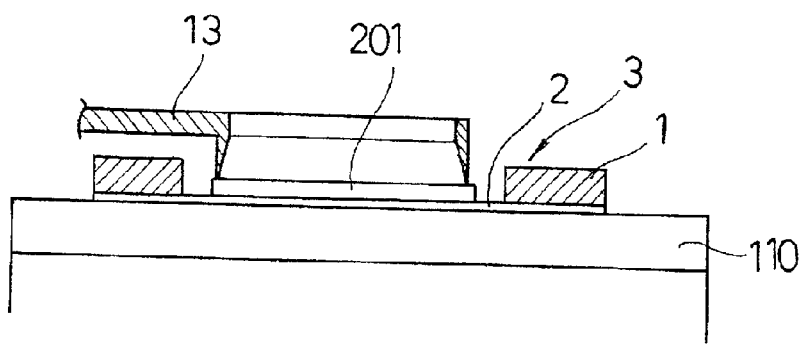
FIG. 7 is a cross-sectional view showing a wafer held on a bonding stage according to yet another embodiment of the invention.
Figure 8:
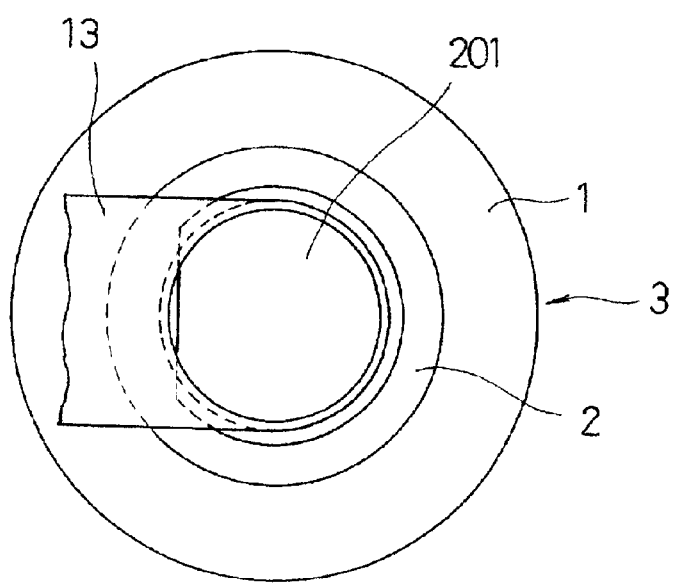
FIG. 8 is a plan view of the wafer held on the bonding stage.

In another method, as shown in FIG. 7 and FIG. 8, a ring-shaped press tool 13 having an approximately same diameter as that of the semiconductor wafer 201, presses the border of the wafer 201. This eliminates the suction holes 111 in the above embodiment, and the wafer is held without wafer damage such as a concave deformation due to the suction force and the break of the circuit.

Figure 9:
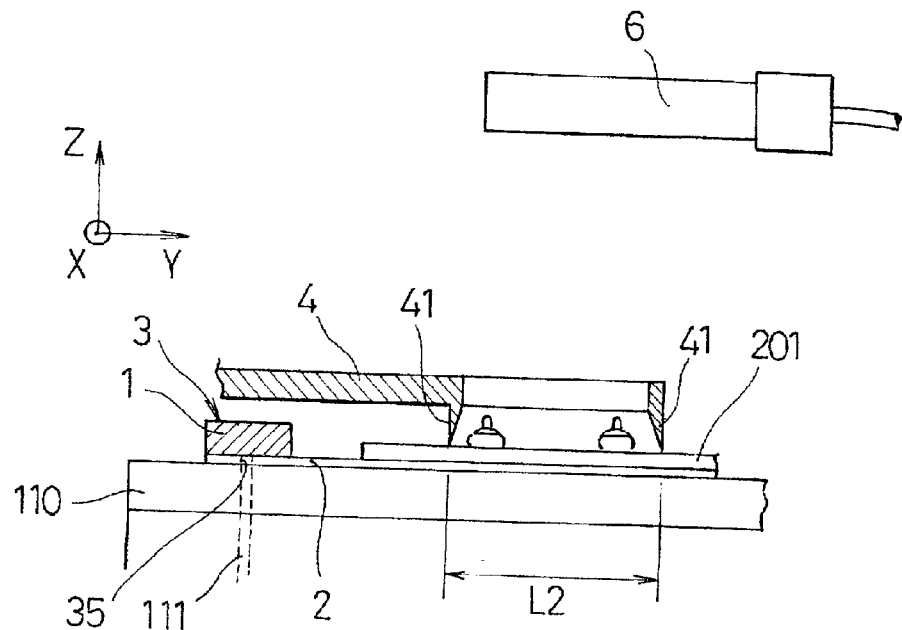
FIG. 9 is a cross-sectional view showing a wafer held on a bonding stage according to still another embodiment of the invention.
Figure 10:
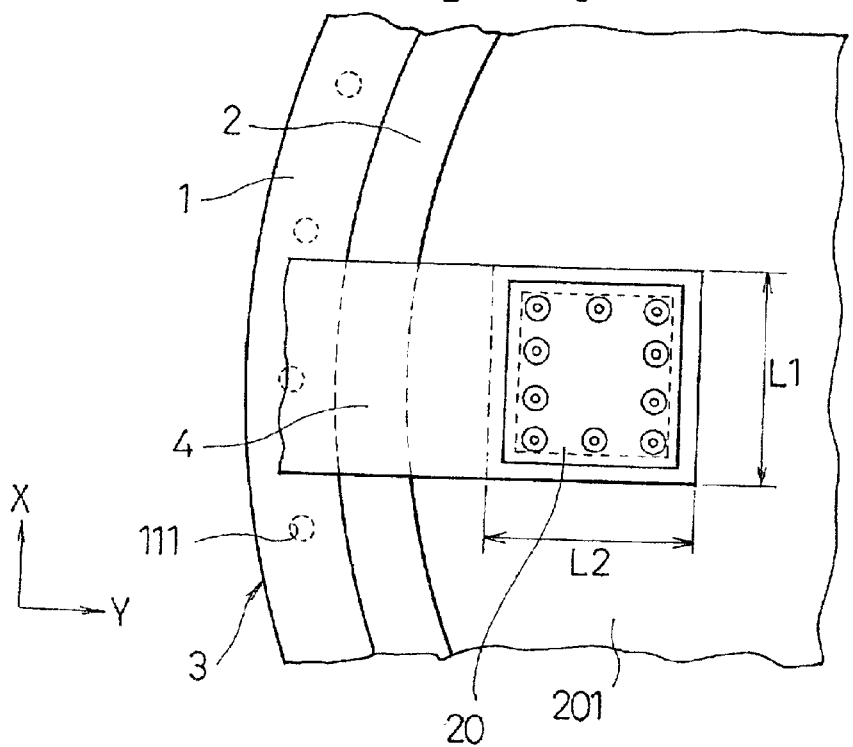
FIG. 10 is a partial enlarged plan view of FIG. 9.

Further, in another method, as shown in FIG. 9 and FIG. 10, a press tool 4 for electrode pads, the tool pressing only predetermined places of the semiconductor wafer 201, is used.

Particularly, regarding the carrier tool 3 transferred onto the bonding stage 110, the protective ring 1 of the tool is held through the suction holes 111. Then, a shown identification camera 6 identifies an IC-forming area 20 formed on the semiconductor wafer 201, accordingly the press tool 4 for the electrode pads, movable along the X, Y, and Z directions, presses and holds surface of the dicing lines of the area 20, and then bonding is performed. Nails 41 at a tip of the tool 4 is provided so as to press a set or two sets of opposite sides of the dicing line defining the IC'S profile (rectangular), and spaces between the opposite nails, L1 and L2, are equal to the spaces between the adjacent dicing lines of the semiconductor wafer 201 along the X direction and Y direction, respectively. After the bump bonding to a predetermined IC-forming area 20 is completed, the identification camera 6 identifies a subsequent IC-forming area 20, the press tool 4 for electrode pads presses and holds the surface of the dicing lines of the IC-forming area 20, and then bonding is performed. The above operation is repeated until the bonding is completed in any IC-forming area 20 on the semiconductor wafer 201.

By holding the wafer using the press tool 4 for electrode pads, the semiconductor wafer 201 is held in any region without damage of the wafer due to the concave deformation by the suction force and the break of the circuit.

According to the invention, a thin semiconductor wafer is carried and held on a bonding stage without damage such as a crack, chipping, and break of the circuit.

In addition, the damage of the wafer and the break of the circuit due to the concave deformation of the area over the suction holes caused by the suction force when the thin semiconductor wafer is subjected to the suction force and held are prevented. Furthermore, the non-deposition of the bump or wire due to the reduction of the ultrasonic wave transmission, and crash of the wafer caused by the ball press tool and the rising of the border of the wafer during the bonding are avoided.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A bonding method comprising the procedures of:
   making a semiconductor wafer adhere to a sheet of a carrier tool having a protective ring with the sheet extended over an underside of the protective ring;
   arranging through-holes in the sheet at positions below the semiconductor wafer to enable suction to be applied through the through-holes to cause adherence of the semiconductor wafer to the sheet;
   carrying the semiconductor wafer while surrounded by the protective ring from a first container device to a bonding stage;
   performing a bonding to the semiconductor wafer on the bonding stage while the semiconductor wafer is held on the bonding stage; and
   carrying the wafer out of the bonding stage to a second container device.

2. The bonding method according to claim 1, wherein the sheet is made of a heat resistant resin sheet.

3. The bonding method according to claim 1, wherein the semiconductor wafer is held on the bonding stage by adherently holding the wafer via the sheet by a suction device provided in the bonding stage.

4. The bonding method according to claim 3, wherein the semiconductor wafer is adherently held via the sheet through a plurality of suction holes located in positions corresponding to a border of the semiconductor wafer or a suction hole with an annular groove located in a position corresponding to a border of the semiconductor wafer, these suction holes opening to an upper face of the bonding stage.

5. The bonding method according to claim 4, wherein the through-holes are arranged in the sheet at positions corresponding to the positions of the plurality of suction holes or the position of the suction hole with the annular groove.

6. The bonding method according to claim 3, wherein the semiconductor wafer is made to adhere to the bonding stage via the sheet by suction through a porous plate arranged on the bonding stage.

7. The bonding method according to claim 1, wherein the semiconductor wafer is held on the bonding stage by pressing an upper face of the wafer along its border using a press tool.

8. The bonding method according to claim 1, wherein the semiconductor wafer is held on the bonding stage by making the protective ring adhere to the bonding stage by a suction device provided in the bonding stage, and pressing borders of respective IC-forming areas of the semiconductor wafer using a press tool.

9. The bonding method according to claim 1, wherein the semiconductor wafer is carried in and out while the protective ring is continuously held.

10. The bonding method according to claim 9, wherein the protective ring is held based on effect of adhesion and/or pinch.

11. A bonding apparatus comprising:
    a carrier tool for holding a semiconductor wafer, the carrier tool having a sheet to which the semiconductor wafer is adhered, and a protective ring arranged on the sheet so as to surround the semiconductor wafer, the sheet including through-holes arranged at positions below the semiconductor wafer to enable suction to be applied through the through-holes to cause adherence of the semiconductor wafer to the sheet;
    a carry-in side container for containing the carrier tool holding the semiconductor wafer;
    a bonding stage for adherently holding the semiconductor wafer via the sheet of the carrier tool;
    a bonding device for performing bonding to the semiconductor wafer held on the bonding stage;
    a carry-in device for adherently holding the protective ring of the carrier tool holding the semiconductor wafer, and transferring the carrier tool from the carry-in side container device to the bonding stage;
    a carry-out side container for containing the carrier tool holding the semiconductor wafer; and
    a carry-out device for adherently holding the protective ring of the carrier tool holding the semiconductor wafer, and transferring the carrier tool from the bonding stage to the carry-out side container device.

12. A bonding method comprising the steps of:
    making a semiconductor wafer adhere to a sheet of a carrier tool having a protective ring with the sheet extended over an underside of the protective ring;
    carrying the semiconductor wafer while surrounded by the protective ring from a first container device to a bonding stage;
    holding the semiconductor wafer on the bonding stage by adherently holding the wafer via the sheet by means of a suction device which applies suction through a plurality of suction holes in the bonding stage located in positions corresponding to a border of the semiconductor wafer or through a suction hole with an annular groove in the bonding stage located in a position corresponding to a border of the semiconductor wafer, the plurality of suction holes or the suction hole with the annular groove opening to an upper face of the bonding stage;
    arranging through-holes in the sheet at positions corresponding to the positions of the plurality of suction holes or to the position of the suction hole with the annular groove to enable suction to be applied through the through-holes to cause adherence of the semiconductor wafer to the sheet;
    performing a bonding to the semiconductor wafer on the bonding stage while the semiconductor wafer is held on the bonding stage; and
    carrying the wafer out of the bonding stage to a second container device.

13. The bonding method according to claim 12, wherein the sheet is made of a heat resistant resin sheet.

14. The bonding method according to claim 12, wherein the semiconductor wafer is further held on the bonding stage by pressing borders of respective IC-forming areas of the semiconductor wafer using a press tool.

15. The bonding method according to claim 12, wherein the semiconductor wafer is carried in and out while the protective ring is continuously held.

16. The bonding method according to claim 15, wherein the protective ring is held based on effect of adhesion and/or pinch.

17. A bonding method comprising the steps of:

making a semiconductor wafer adhere to a sheet of a carrier tool having a protective ring with the sheet extended over an underside of the protective ring;

carrying the semiconductor wafer while surrounded by the protective ring from a first container device to a bonding stage;

performing a bonding to the semiconductor wafer on the bonding stage while the semiconductor wafer is held on the bonding stage;

holding the semiconductor wafer on the bonding stage by adherently holding the wafer via the sheet by means of a suction device which applies suction through a porous plate arranged on the bonding stage;

carrying the wafer out of the bonding stage to a second container device; and arranging through-holes in the sheet to enable suction to be applied through the through-holes to cause adherence of the semiconductor wafer to the sheet.

18. The bonding method according to claim 17, wherein the sheet is made of a heat resistant resin sheet.

19. The bonding method according to claim 17, wherein the semiconductor wafer is further held on the bonding stage by pressing borders of respective IC-forming areas of the semiconductor wafer using a press tool.

20. The bonding method according to claim 17, wherein the semiconductor wafer is carried in and out while the protective ring is continuously held.

* * * * *